United States Patent
Ashimori (10) Patent No.: US 7,997,135 B2
(45) Date of Patent: Aug. 16, 2011

(54) ANGULAR VELOCITY SENSOR

(75) Inventor: Youhei Ashimori, Fukui (JP)

(73) Assignee: Panasonic Corporation, Osaka (JP)

( * ) Notice: Subject to any disclaimer, the term of this patent is extended or adjusted under 35 U.S.C. 154(b) by 351 days.

(21) Appl. No.: 12/514,377

(22) PCT Filed: Dec. 11, 2007

(86) PCT No.: PCT/JP2007/073813
§ 371 (c)(1),
(2), (4) Date: May 11, 2009

(87) PCT Pub. No.: WO2008/078542
PCT Pub. Date: Jul. 3, 2008

(65) Prior Publication Data
US 2010/0043548 A1 Feb. 25, 2010

(30) Foreign Application Priority Data
Dec. 22, 2006 (JP) ................. 2006-345485

(51) Int. Cl.
*G01C 19/00* (2006.01)
*G01P 15/08* (2006.01)

(52) U.S. Cl. .................................. 73/504.16
(58) Field of Classification Search ............... 73/504.16, 73/510, 760
See application file for complete search history.

(56) References Cited

U.S. PATENT DOCUMENTS

| | | | | |
|---|---|---|---|---|
| 5,438,231 A | * | 8/1995 | Khoshnevisan et al. ...... | 310/321 |
| 6,116,087 A | * | 9/2000 | Asami et al. ............... | 73/504.16 |
| 6,119,518 A | * | 9/2000 | Itou et al. ................... | 73/504.16 |
| 6,666,091 B2 | * | 12/2003 | Hatanaka et al. .......... | 73/504.16 |
| 7,002,284 B2 | * | 2/2006 | Ouchi et al. ................. | 310/370 |
| 7,107,843 B2 | * | 9/2006 | Ohuchi et al. ............. | 73/504.16 |
| 2007/0182291 A1 | * | 8/2007 | Isobe et al. .................... | 310/370 |

FOREIGN PATENT DOCUMENTS

| | | |
|---|---|---|
| JP | 09-069749 A | 3/1997 |
| JP | 2002-257549 A | 9/2002 |
| JP | 2005-091287 A | 4/2005 |
| JP | 2005-249395 A | 9/2005 |

OTHER PUBLICATIONS

International Search Report for PCT/JP2007/073813.

* cited by examiner

*Primary Examiner* — Max Noori
(74) *Attorney, Agent, or Firm* — Pearne & Gordon LLP (57) ABSTRACT

An angular velocity sensor includes a drive electrode section (26) for inputting a drive signal for driving a detecting element (21), a monitor electrode section (28) detecting the drive status of the detecting element (21) and outputting a monitor signal, and a sensing electrode section (27) outputting a sensing signal, which is generated due to an angular velocity given to the detecting element (21). The drive electrode section (26), the monitor electrode section (28), and the sensing electrode section (27) each have a lower electrode formed on a substrate, a piezoelectric film formed of a piezoelectric material on the lower electrode, and an upper electrode formed on the piezoelectric film. The capacitance value between the upper and lower electrodes of the monitor electrode section (28) is set to be equal to the capacitance value between the upper and lower electrodes of the sensing electrode section (27), and the resistance value between both end portions of the monitor electrode section (28) is set to be equal to the resistance value between both end portions of the sensing electrode section (27).

3 Claims, 9 Drawing Sheets

ANGULAR VELOCITY SENSOR

TECHNICAL FIELD

The present invention relates to an angular velocity sensor adapted for use in various electronic apparatuses.

BACKGROUND ART

Hereinafter, a known angular velocity sensor will be described with reference to the drawings.

Figure 7:
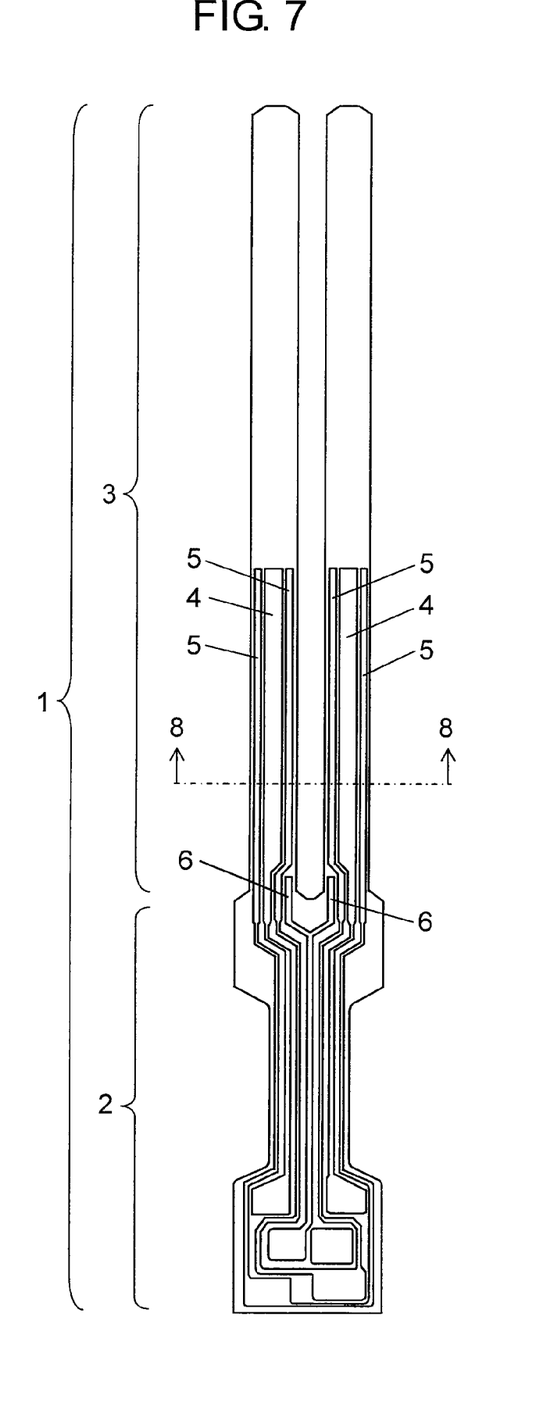
FIG. 7 is a plan view of an arm section of a detecting element, which is used in a known angular velocity sensor.
Figure 8:
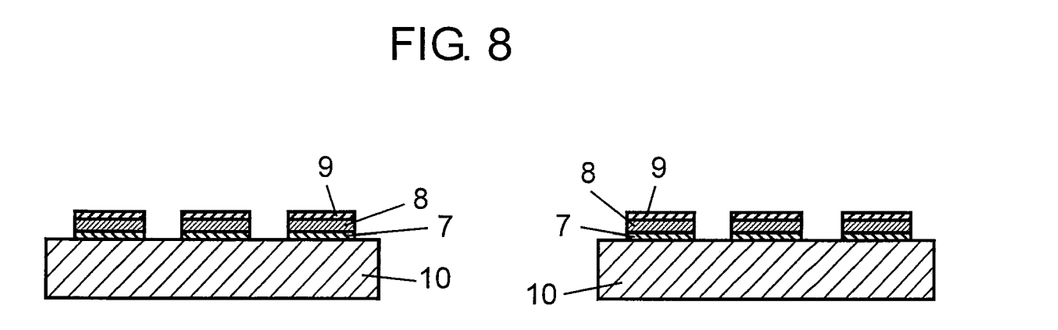
FIG. 8 is a sectional view taken along the line 8-8 of FIG. 7.

FIG. 7 is a plan view of a detecting element which is used in a known angular velocity sensor. FIG. 8 is a sectional view of an arm section of a detecting element, which is used in the same angular velocity sensor, taken along the line 8-8.

In FIGS. 7 and 8, the known angular velocity sensor has detecting element 1 for angular velocity detection, an electronic circuit (not shown) connected to detecting element 1, and a case (not shown) housing detecting element 1 and the electronic circuit.

Detecting element 1 has a tuning fork shape in which a pair of arm sections 3 are provided in shaft section 2. Drive electrode section 4 and sensing electrode section 5 are provided to extend from arm sections 3 to shaft section 2. Monitor electrode section 6 is provided to extend from arm sections 3 near shaft section 2 to shaft section 2.

Drive electrode section 4 is an electrode for inputting a drive signal for driving detecting element 1. Monitor electrode section 6 is an electrode detecting the drive status of detecting element 1 and outputting a monitor signal. Sensing electrode section 5 is an electrode outputting a sensing signal, which is generated due to an angular velocity given to detecting element 1.

As shown in FIG. 8, drive electrode section 4, monitor electrode section 6, and sensing electrode section 5 each have lower electrode 7 formed on a tuning fork-shaped substrate, piezoelectric film 8 formed of a piezoelectric material on lower electrode 7, and upper electrode 9 formed on piezoelectric film 8. A conductive layer that becomes lower electrode 7 is formed on silicon base 10, piezoelectric film 8 is formed on the conductive layer, and a conductive layer that becomes upper electrode 9 is formed on piezoelectric film 8. The conductive layers and piezoelectric film 8 are dry etched to have a predetermined shape.

When minute detecting element 1 is formed, if wet etching is used, the conductive layer that becomes lower electrode 7 or upper electrode 9 or piezoelectric film 8 may be unduly etched by an etchant, and the characteristics may be deteriorated. For this reason, the conductive layer or piezoelectric film is treated by dry etching capable of comparatively accurately etching only a necessary section.

The operation status of the known angular velocity sensor will be described.

If a drive signal is input to drive electrode section 4, a pair of arm sections 3 are driven to vibrate. In a state where a pair of arm sections 3 are driven to vibrate, if an angular velocity is given to detecting element 1, a pair of arm sections 3 are deflected in a direction in which a Coriolis force is applied, and a sensing signal is output from sensing electrode section 5. A monitor signal that is synchronized with vibration of a pair of arm sections 3 is also output from monitor electrode section 6.

When an angular velocity is given to detecting element 1, arms sections 3 are deflected, and a sensing signal is output from sensing electrode section 5 of detecting element 1. The sensing signal is detected based on a detection signal generated from the monitor signal, which is output from monitor electrode section 6, and then an angular velocity signal is detected.

Figure 9:
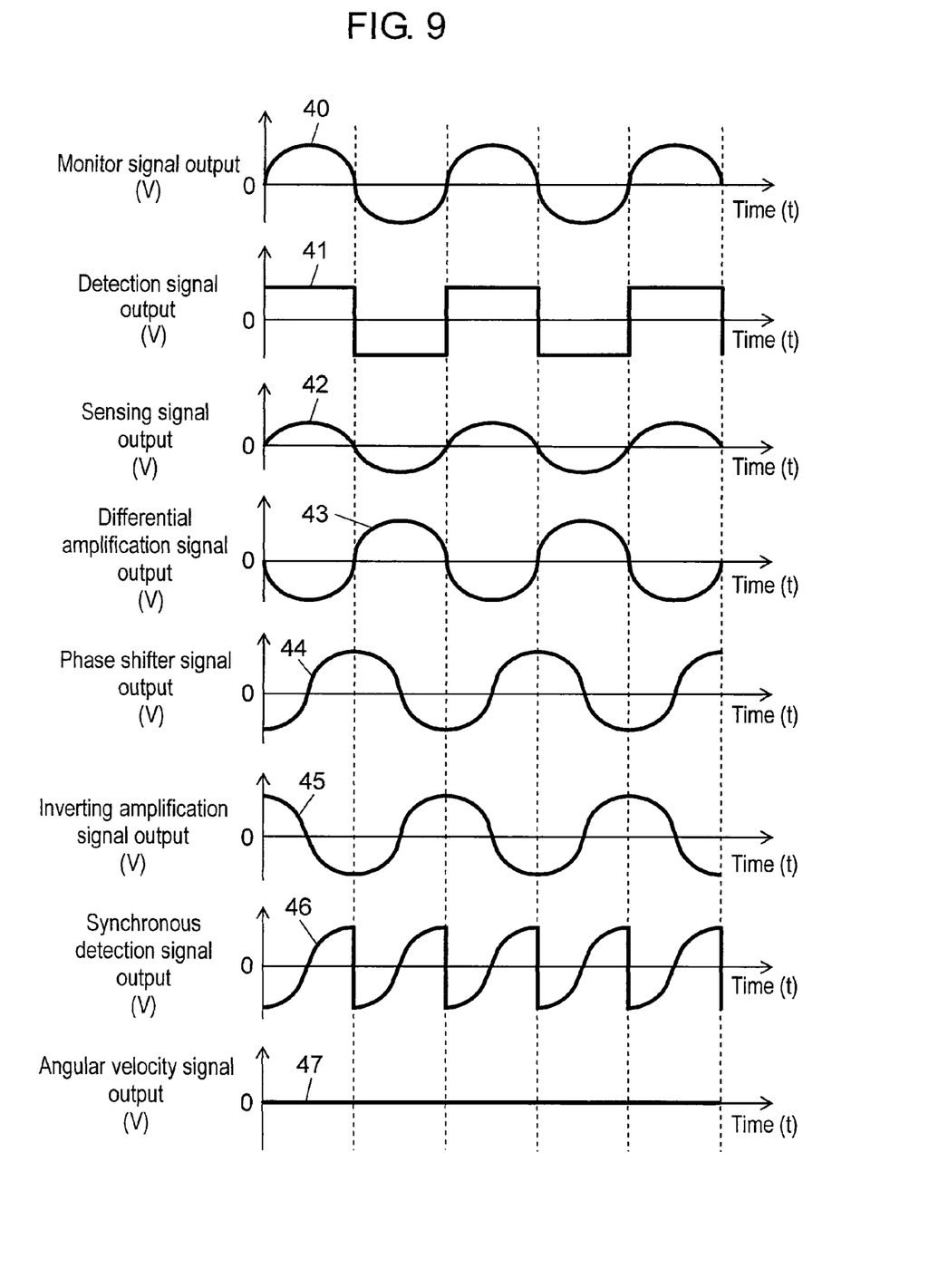
FIG. 9 is a diagram showing characteristic waveforms of a signal processing regarding noise component filtering of the known angular velocity sensor.

In this instance, the sensing signal is output with an angular velocity component and a noise component superimposed thereon. FIG. 9 shows characteristic waveforms of a signal processing regarding noise component filtering in a state where no angular velocity is given to detecting element 1 (in a state where no angular velocity component is generated). In respective waveform charts of FIG. 9, the vertical axis denotes voltage (V), and the horizontal axis denotes time (t).

As shown in FIG. 9, detection signal 41 is generated from monitor signal 40, and differential amplification signal 43 is generated from sensing signal 42. Phase shifter signal 44 and inverting amplification signal 45 are generated from differential amplification signal 43. Phase shifter signal 44 and inverting amplification signal 45 are detected based on detection signal 41 to generate synchronous detection signal 46. Synchronous detection signal 46 is smoothed to detect angular velocity signal 47. No angular velocity component is generated in angular velocity signal 47, and thus angular velocity signal 47 becomes "0".

For example, Patent Document 1 is an example of related art.

In general, sensing electrode section 5 or monitor electrode section 6 has lower electrode 7 and upper electrode 9 with piezoelectric film 8 interposed therebetween. For this reason, capacitance is formed between lower electrode 7 and upper electrode 9. Due to capacitance, sensing signal 42 that is output from sensing electrode section 5 is phase-shifted, and monitor signal 40 that is output from monitor electrode section 6 is phase-shifted. As a change in temperature increases, the phase shift amount increases. Sensing signal 42 and monitor signal 40 are different in the phase shift amount with respect to the change in temperature. As the change in temperature increases, a difference in the phase shift amount between sensing signal 42 and monitor signal 40 increases.

Figure 10:
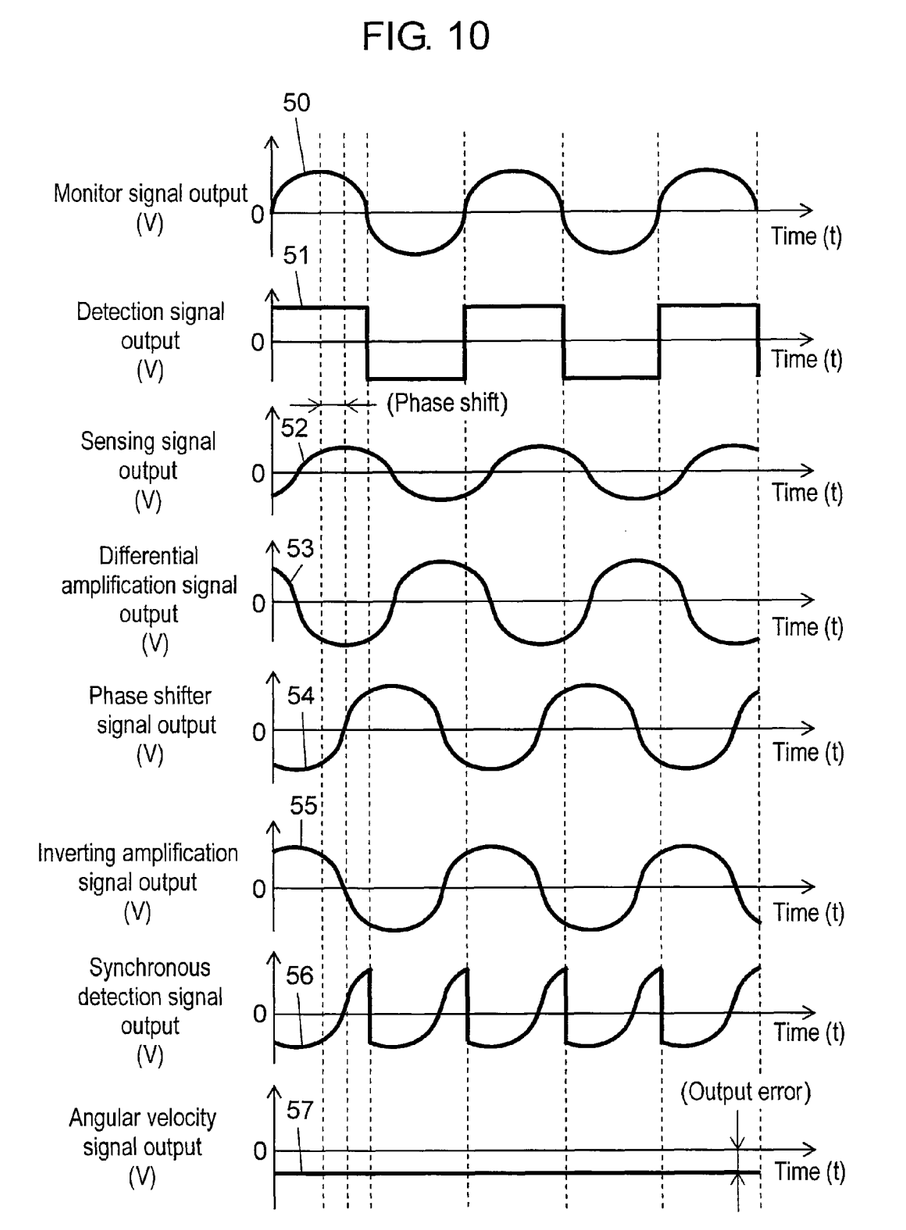
FIG. 10 is a diagram showing characteristic waveforms of a signal processing regarding noise component filtering of the known angular velocity sensor.

FIG. 10 shows characteristic waveforms of a signal processing regarding noise component filtering when a difference in the phase shift amount increases. In respective waveform charts of FIG. 10, the vertical axis denotes voltage (V), and the horizontal axis denotes time (t). In FIG. 10, detection signal 51 is generated from monitor signal 50, differential amplification signal 53 is generated from sensing signal 52, and phase shifter signal 54 and inverting amplification signal 55 are generated from differential amplification signal 53. It is assumed that phase shifter signal 54 and inverting amplification signal 55 are detected based on detection signal 51 to generate synchronous detection signal 56, and synchronous detection signal 56 is smoothed to detect angular velocity signal 57.

As shown in FIG. 10, if a difference in the phase shift amount increases, sensing signal 52 is phase-shifted. For this reason, phase shifter signal 54 and inverting amplification signal 55 that are detected based on detection signal 51 are phase-shifted. As a result, appropriate synchronous detection cannot be performed. That is, although no angular velocity component is generated in angular velocity signal 57, an output voltage is generated and becomes a detection error.

As described above, according to the known configuration, sensing signal 52 and monitor signal 50 are phase-shifted or a difference in the phase shift amount between sensing signal 52 and monitor signal 50 changes depending on a change in temperature. When an angular velocity is detected from sensing signal 52 based on detection signal 51 generated from monitor signal 50, a detection error of an angular velocity is likely to occur.

[Patent Document 1] Japanese Patent Unexamined Publication No. 2002-257549

DISCLOSURE OF THE INVENTION

The invention has been finalized in order to solve the above-described problems, and it is an object of the invention to provide an angular velocity sensor with improved detection accuracy of an angular velocity.

An angular velocity sensor according to the invention includes a detecting element for angular velocity detection. The detecting element includes a drive electrode section for inputting a drive signal for driving the detecting element, a monitor electrode section detecting the drive status of the detecting element and outputting a monitor signal, and a sensing electrode section outputting a sensing signal, which is generated due to an angular velocity given to the detecting element. The drive electrode section, the monitor electrode section, and the sensing electrode section each have a lower electrode formed on a substrate, a piezoelectric film formed of a piezoelectric material on the lower electrode, and an upper electrode formed on the piezoelectric film. The capacitance value between the upper and lower electrodes of the monitor electrode section is set to be equal to the capacitance value between the upper and lower electrodes of the sensing electrode section, and the resistance value between both end portions of the monitor electrode section is set to be equal to the resistance value between both end portions of the sensing electrode section.

According to the invention, the monitor electrode section and the sensing electrode section have the same capacitance value. For this reason, although the sensing signal that is output from the sensing electrode section and the monitor signal that is output from the monitor electrode section are phase-shifted, the sensing signal and the monitor signal can have the same phase shift amount with respect to a change in temperature. That is, since the sensing signal and the monitor signal have the same phase shift amount with respect to the change in temperature, even if the sensing signal is detected based on the monitor signal, a difference in the phase shift amount is not changed. As a result, it is possible to suppress a detection error of an angular velocity with respect to a change in temperature, and thus to improve detection accuracy of an angular velocity.

DESCRIPTION OF REFERENCE NUMERALS AND SIGNS

21: detecting element
22: electronic circuit
23: case
24: shaft section
25: arm section
26: drive electrode section
27: sensing electrode section
28: monitor electrode section
28a: portion
29: substrate
30: lower electrode
31: piezoelectric film
32: upper electrode
33: amplification circuit

BEST MODE FOR CARRYING OUT THE INVENTION

Hereinafter, an angular velocity sensor according to an embodiment of the invention will be described with reference to the drawings.

Figure 1:
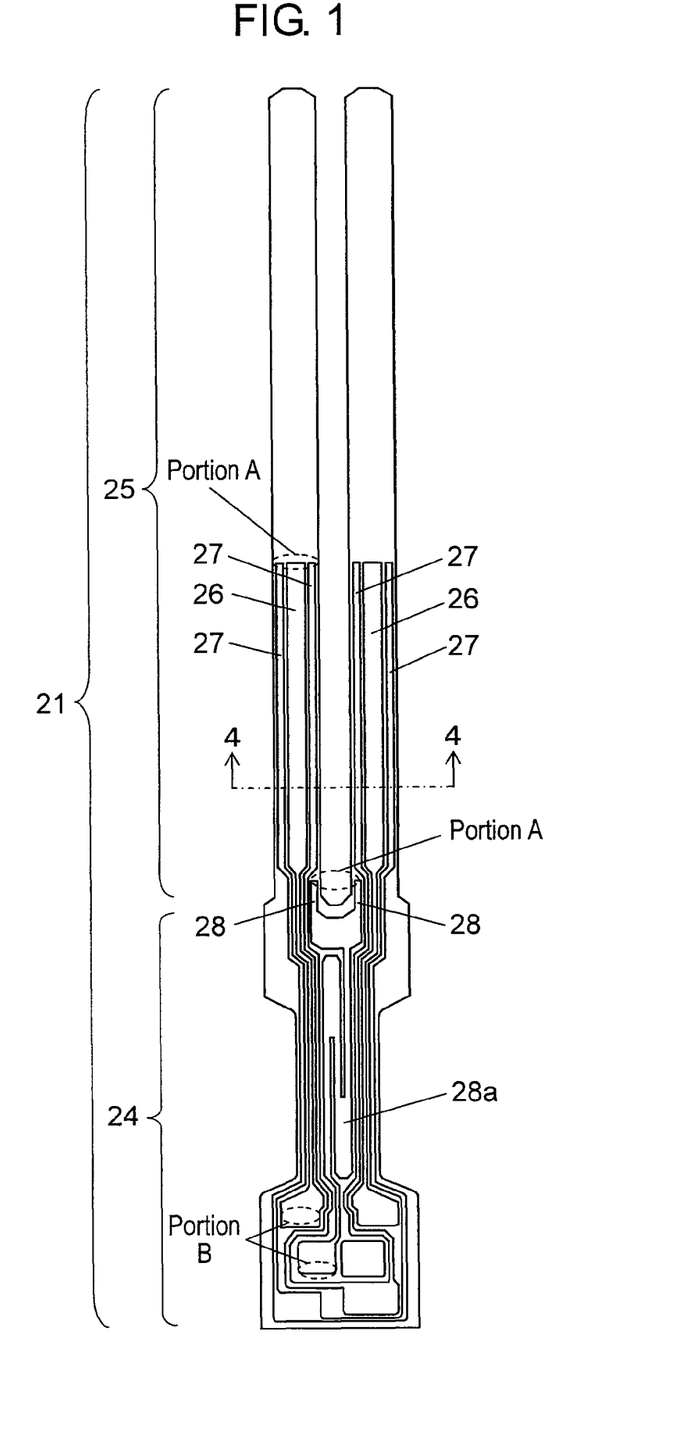
FIG. 1 is a plan view of a detecting element that is used in an angular velocity sensor according to an embodiment of the invention.
Figure 2:
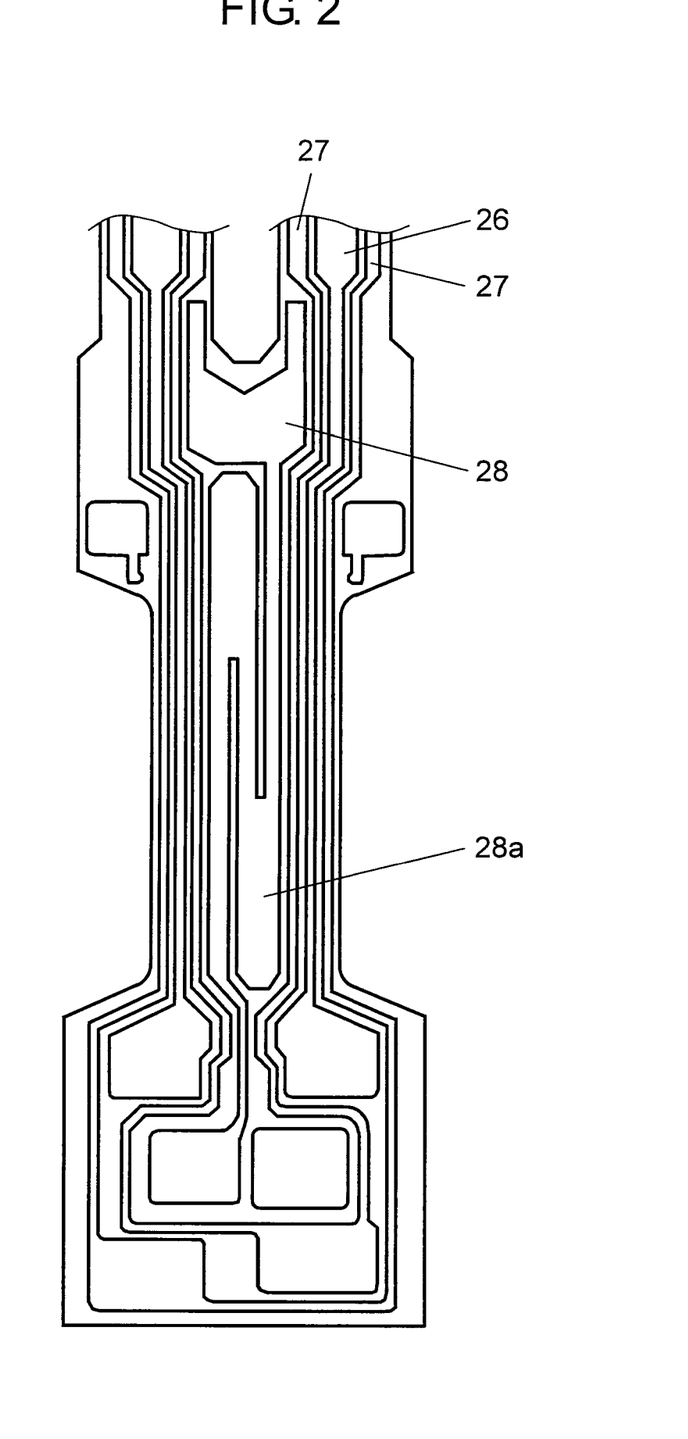
FIG. 2 is an enlarged view of a shaft section of a detecting element, which is used in the angular velocity sensor.
Figure 3:
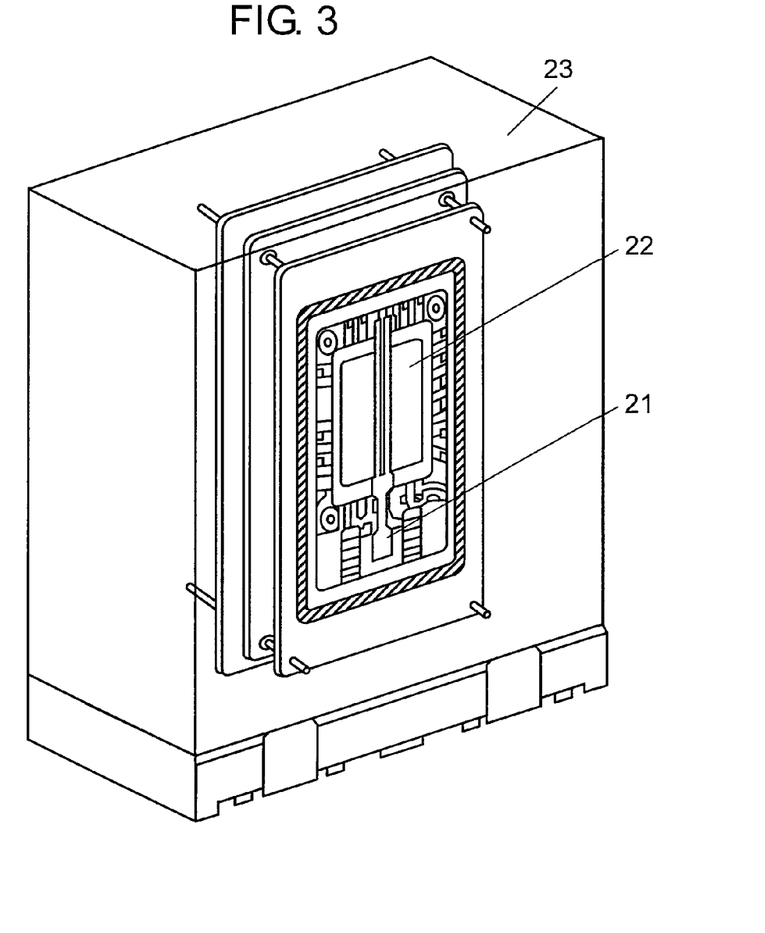
FIG. 3 is a partial perspective view of the angular velocity sensor.

FIG. 1 is a plan view of a detecting element that is used in an angular velocity sensor according to an embodiment of the invention. FIG. 2 is an enlarged view of a shaft section of the detecting element. FIG. 3 is a partial perspective view of the angular velocity sensor.

In FIGS. 1 to 3, the angular velocity sensor of this embodiment includes detecting element 21 for angular velocity detection, electronic circuit 22 connected to detecting element 21, and case 23 housing detecting element 21 and electronic circuit 22.

Detecting element 21 has a tuning fork shape in which a pair of arm sections 25 are provided in shaft section 24. Detecting element 21 includes drive electrode section 26 and sensing electrode section 27 provided to extend from arm sections 25 to shaft section 24, and monitor electrode section 28 provided to extend from arm sections 25 near shaft section 24 to shaft section 24.

Drive electrode section 26 is an electrode for inputting a drive signal for driving detecting element 21.

Monitor electrode section 28 is an electrode detecting the drive status of detecting element 21 and outputting a monitor signal.

Sensing electrode section 27 is an electrode outputting a sensing signal, which is generated due to an angular velocity given to detecting element 21.

Figure 4:
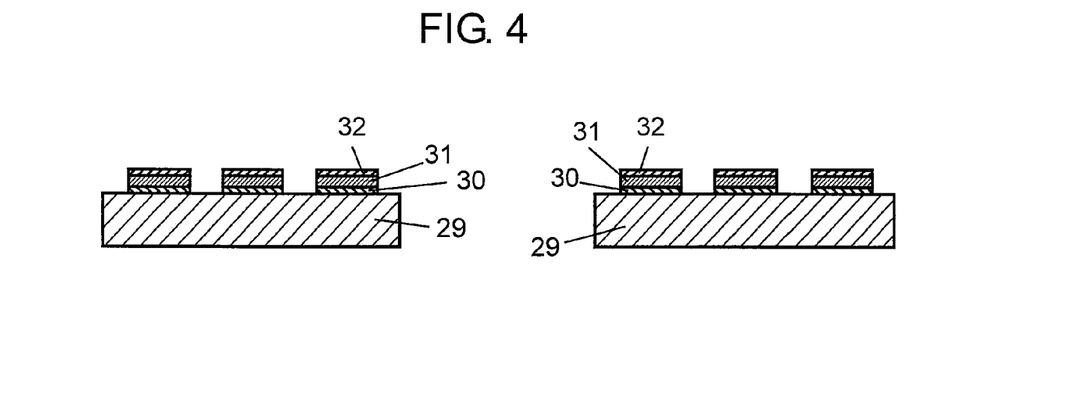
FIG. 4 is a sectional view taken along the line 4-4 of FIG. 1.

As shown in FIG. 4, drive electrode section 26, monitor electrode section 28, and sensing electrode section 27 each have lower electrode 30 formed on tuning fork-shaped substrate 29, piezoelectric film 31 formed of a piezoelectric material, such as lead zirconate titanate (PZT), on lower electrode 30, and upper electrode 32 formed on piezoelectric film 31. A conductive layer that becomes lower electrode 30 is formed on silicon substrate 29, piezoelectric film 31 is formed on the conductive layer, and a conductive layer that becomes upper electrode 32 is formed on piezoelectric film 31. The conductive layers and piezoelectric film 31 are treated to have a predetermined shape. This treatment is performed such that the capacitance value between upper and lower electrodes 32 and 30 of monitor electrode section 28 becomes equal to the capacitance value between upper and lower electrodes 32 and 30 of sensing electrode section 27, and the resistance value between both end portions (between portions A and B) of monitor electrode section 28 becomes equal to the resistance value between both end portions (between portions A and B) of sensing electrode section 27.

In order to make the capacitance values become equal, monitor electrode section 28 and sensing electrode section 27 are formed to have the same area. For example, as shown in FIG. 1, in the case of tuning fork-shaped detecting element 21, monitor electrode section 28 has a short relay distance in shaft section 24. For this reason, like portion 28a of monitor electrode section 28 corresponding to shaft section 24, the relay distance is extended to ensure a predetermined area. Incidentally, the predetermined area means such an area that monitor electrode section 28 has the same area as sensing electrode section 27.

In order to make the resistance values become equal, with respect to coefficient Kr, which is determined by length (L) and width (W) by relay, monitor electrode section 28 and sensing electrode section 27 are configured to have the same value. Here, the relationship Kr=L/W is established. For example, as shown in FIG. 1, in the case of tuning fork-shaped detecting element 21, monitor electrode section 28 has a short relay distance in shaft section 24. For this reason, like portion 28a of monitor electrode section 28 corresponding to shaft section 24, a relay length (L) is extended and a predetermined width (W) is set such that coefficient Kr becomes equal between monitor electrode section 28 and sensing electrode section 27.

When minute detecting element 21 is formed, if wet etching is used, the conductive layer that becomes lower electrode 30 or upper electrode 32 or piezoelectric film 31 may be unduly etched by an etchant, and the characteristics may be deteriorated. For this reason, the conductive layer or piezoelectric film 31 is treated by dry etching capable of comparatively accurately etching only a necessary section.

The operation status of the angular velocity sensor will be described.

If a drive signal is input to drive electrode section 26, a pair of arm sections 25 are driven to vibrate. In a state where a pair of arm sections 25 are driven to vibrate, if an angular velocity is given to detecting element 21, a pair of arm sections 25 are deflected in a direction in which a Coriolis force is applied, and a sensing signal is output from sensing electrode section 27. A signal that is synchronized with vibration of a pair of arm sections 25 is output from monitor electrode section 28.

When an angular velocity is given to detecting element 21, arm sections 25 are deflected, and a sensing signal is output from sensing electrode section 27 of detecting element 21. The sensing signal is detected based on a monitor signal, which is output from monitor electrode section 28, and thus an angular velocity is detected. In this case, the sensing signal is output with an angular velocity component and a noise component superimposed thereon.

Figure 5:
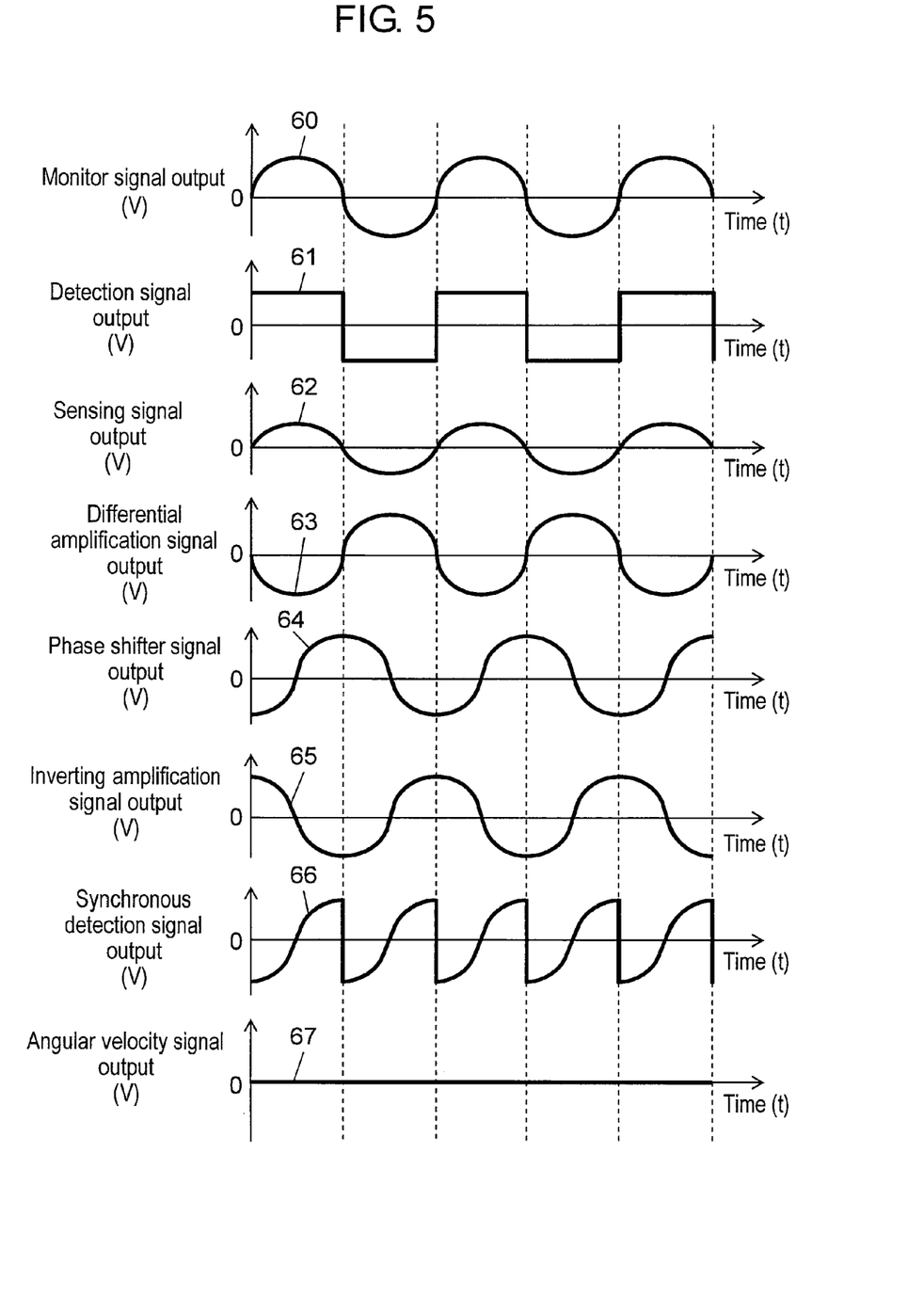
FIG. 5 is a diagram showing characteristic waveforms of a signal processing regarding noise component filtering of the angular velocity sensor.

FIG. 5 shows characteristic waveforms of a signal processing regarding noise component filtering in a state where no angular velocity is given to detecting element 1 (in a state where no angular velocity component is generated). In respective waveform charts of FIG. 5, the vertical axis denotes voltage (V), and the horizontal axis denotes time (t).

As shown in FIG. 5, detection signal 61 is generated from monitor signal 60, differential amplification signal 63 is generated from sensing signal 62, and phase shifter signal 64 and inverting amplification signal 65 are generated from differential amplification signal 63. Phase shifter signal 64 and inverting amplification signal 65 are detected based on detection signal 61 to generate synchronous detection signal 66. Synchronous detection signal 66 is smoothed to detect angular velocity signal 67. No angular velocity component is generated in angular velocity signal 67, and thus angular velocity signal 67 becomes "0".

Figure 6:
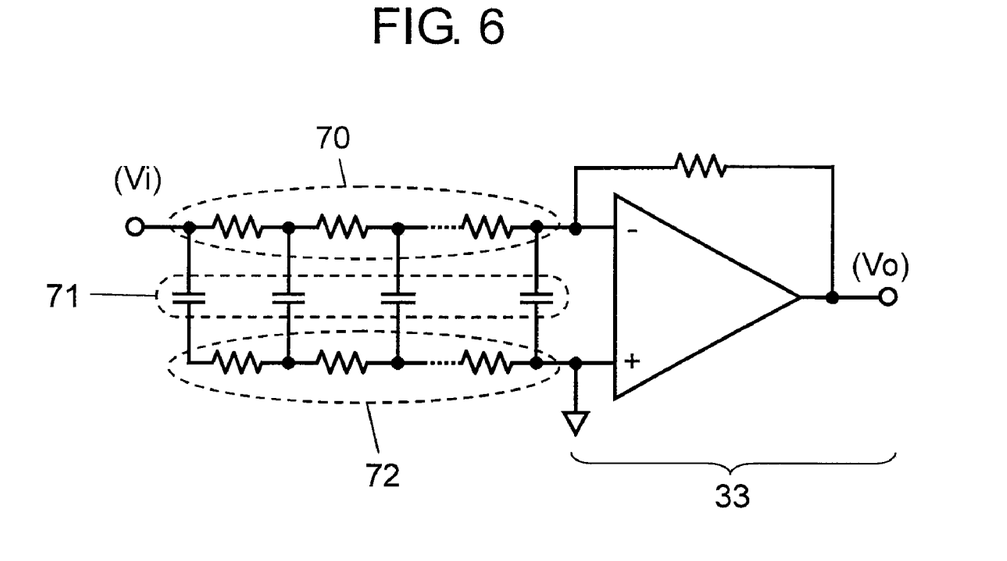
FIG. 6 is an explanatory view showing a resistive component and a capacitive component of a sensing electrode section, which is connected to an amplification circuit.

When differential amplification signal 63 is generated from sensing signal 62, for example, as shown in FIG. 6, amplification circuit 33 connected to sensing electrode section 27 is used. In this case, resistive components 70 and 72 and capacitive component 71 are generated in upper and lower electrodes 32 and 30 of sensing electrode section 27, and the capacitive value and the resistive value of sensing electrode section 27 are set to be equal to the capacitive value and the resistive value of monitor electrode section 28, respectively. If sensing signal 62 is at Vi, and differential amplification signal 63 is at Vo, a phase shift angle (θio) in sensing signal 62 is expressed by (Equation 1).

$$\theta io = \angle Vo/Vi = -\tan^{-1}(\omega CR) \quad \text{[Equation 1]}$$

With the above-described configuration, the capacitance values of monitor electrode section 28 and sensing electrode section 27 are set to be equal. For this reason, although sensing signal 62 that is output from sensing electrode section 27 and monitor signal 60 that is output from monitor electrode section 28 are phase-shifted, sensing signal 62 and monitor signal 60 can have the same phase shift amount with respect to a change in temperature. That is, the capacitance values and resistance values of sensing electrode section 27 and monitor electrode section 28 are different depending on temperature. Accordingly, with respect to a time constant that is determined by product of the capacitance value (C) and the resistance value (R) in respective electrodes, the electrodes are configured to have the same value, and the treatment is performed such that the capacitance value of sensing electrode section 27 becomes equal to the capacitance value of monitor electrode section 28, and the resistance value of sensing electrode section 27 becomes equal to the resistance value of monitor electrode section 28. With respect to the time constant T, the relationship T=CR is established. Accordingly, the phase shift amount with respect to a change in temperature becomes equal between sensing signal 62 and monitor signal 60. For this reason, even if sensing signal 62 is detected based on detection signal 61, which is generated from monitor signal 60, a difference in phase shift is not changed. Therefore, appropriate synchronous detection can be realized, and a detection error of an angular velocity with respect to a change in temperature can be suppressed. As a result, detection accuracy of an angular velocity can be improved.

The resistance value between both end portions of monitor electrode section 28 is set to be equal to the resistance value between both end portions of sensing electrode section 27. For this reason, a noise component included in the sensing signal output in a state where no angular velocity is given (in a state where no angular velocity component is generated), for example, a noise component due to leakage of the drive signal for driving arm sections 25 or the like can be cancelled. As a result, detection accuracy of an angular velocity can be improved.

Although a case in which PZT having high conversion efficiency of electrical and mechanical energy is used as the piezoelectric material has been described, other piezoelectric materials having the same piezoelectric effect may be used. For example, barium titanate-based materials, or bismuth series, such as potassium bismuth titanate and the like, may be used. In this way, the piezoelectric materials having a piezoelectric effect may be used for the piezoelectric film and similarly, detection accuracy of an angular velocity can be improved.

INDUSTRIAL APPLICABILITY

The angular velocity sensor according to the invention can improve detection accuracy, and is useful for various electronic apparatuses.

The invention claimed is:

1. An angular velocity sensor comprising:
    a detecting element for angular velocity detection,
    wherein the detecting element includes
    a drive electrode section for inputting a drive signal for driving the detecting element,
    a monitor electrode section detecting the drive status of the detecting element and outputting a monitor signal, and
    a sensing electrode section outputting a sensing signal, which is generated due to an angular velocity given to the detecting element,
    the drive electrode section, the monitor electrode section, and the sensing electrode section each include
    a lower electrode formed on a substrate,
    a piezoelectric film formed of a piezoelectric material on the lower electrode, and
    an upper electrode formed on the piezoelectric film, and
    the capacitance value between the upper and lower electrodes of the monitor electrode section is set to be equal to the capacitance value between the upper and lower electrodes of the sensing electrode section, and the resistance value between both end portions of the monitor electrode section is set to be equal to the resistance value between both end portions of the sensing electrode section.

2. The angular velocity sensor of claim 1,
    wherein the detecting element has a tuning fork shape in which a pair of arm sections are provided in a shaft section, the drive electrode section and the sensing electrode section are provided in the arm sections, and the monitor electrode section is provided in the arm sections near the shaft section.

3. The angular velocity sensor of claim 1,
    wherein a chief material of the substrate is silicon, and the piezoelectric material is lead zirconate titanate.

* * * * *